US012568735B2

(12) United States Patent
Shin et al.

(10) Patent No.: US 12,568,735 B2
(45) Date of Patent: Mar. 3, 2026

(54) DISPLAY APPARATUS

(71) Applicant: Samsung Display Co., Ltd., Yongin-si (KR)

(72) Inventors: Hyuneok Shin, Yongin-si (KR); Joonyong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 301 days.

(21) Appl. No.: 18/324,618

(22) Filed: May 26, 2023

(65) Prior Publication Data

US 2024/0081101 A1 Mar. 7, 2024

(30) Foreign Application Priority Data

Sep. 5, 2022 (KR) ........................ 10-2022-0112343

(51) Int. Cl.
| | |
|---|---|
| *H01L 29/08* | (2006.01) |
| *G09G 3/3233* | (2016.01) |
| *H10K 59/122* | (2023.01) |
| *H10K 59/80* | (2023.01) |
| *H10K 59/88* | (2023.01) |
| *H10K 102/00* | (2023.01) |

(52) U.S. Cl.
CPC ......... *H10K 59/122* (2023.02); *G09G 3/3233* (2013.01); *H10K 59/80522* (2023.02); *H10K 59/873* (2023.02); *H10K 59/88* (2023.02); *G09G 2300/0819* (2013.01); *G09G 2300/0852* (2013.01); *G09G 2300/0861* (2013.01); *H10K 2102/351* (2023.02)

(58) Field of Classification Search
CPC .... H10K 59/122; H10K 59/873; H10K 59/88; H10K 59/80522; G09G 3/3233; G09G 2300/0819; G09G 2300/0852; G09G 2300/0861
USPC ......................................................... 257/40
See application file for complete search history.

(56) References Cited

U.S. PATENT DOCUMENTS

| | | | |
|---|---|---|---|
| 10,957,756 B2 | 3/2021 | Lee et al. | |
| 11,158,693 B2 | 10/2021 | Chung et al. | |
| 2019/0058156 A1 | 2/2019 | Sun et al. | |

FOREIGN PATENT DOCUMENTS

| | | | | |
|---|---|---|---|---|
| CN | 107482042 A | 12/2017 | | |
| CN | 113471384 A | 10/2021 | | |
| CN | 113871430 A | 12/2021 | | |
| CN | 114141826 A | 3/2022 | | |
| EP | 3629378 A1 * | 4/2020 | ......... | H10D 30/0413 |
| JP | 6777420 B2 | 10/2020 | | |
| KR | 10-2020-0021021 A | 2/2020 | | |
| KR | 10-2020-0039067 A | 4/2020 | | |

* cited by examiner

*Primary Examiner* — Phuc T Dang
(74) *Attorney, Agent, or Firm* — Womble Bond Dickinson (US) LLP

(57) ABSTRACT

A display apparatus comprises a pixel electrode, a bank layer including an inorganic bank layer and a conductive bank layer that are sequentially stacked, and that define a pixel opening overlapping the pixel electrode, an intermediate layer above the pixel electrode and in the pixel opening, and an opposite electrode above the intermediate layer, wherein the conductive bank layer includes a first metal layer, a second metal layer having a tip protruding from the first metal layer toward a center of the pixel opening, and a cover layer covering the second metal layer.

20 Claims, 9 Drawing Sheets

DISPLAY APPARATUS

CROSS-REFERENCE TO RELATED APPLICATION

This application claims priority to, and the benefit of, Korean Patent Application No. 10-2022-0112343, filed on Sep. 5, 2022, in the Korean Intellectual Property Office, the disclosure of which is incorporated by reference herein in its entirety.

BACKGROUND

1. Field

One or more embodiments relate to a display apparatus.

2. Description of the Related Art

Recently, the use of display apparatuses has diversified. Furthermore, as the thickness and weight of a display apparatus have been reduced, the scope of use thereof has been expanded.

Generally, to display an image, a display apparatus may include a plurality of pixels that receive an electrical signal and that emit light. The pixels of an organic light-emitting display device (OLED) each include an organic light-emitting diode as a display element. An organic light-emitting diode may include a pixel electrode, an emission layer, and an opposite electrode.

SUMMARY

A display apparatus according to the related art has a problem in that a difference in luminance occurs between the edge of a display area and the center thereof. One or more embodiments provide a display apparatus in which a difference in luminance between the edge of a display area and the center thereof is reduced. However, such an aspect is just an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a pixel electrode, a bank layer including an inorganic bank layer and a conductive bank layer that are sequentially stacked, and that define a pixel opening overlapping the pixel electrode, an intermediate layer above the pixel electrode and in the pixel opening, and an opposite electrode above the intermediate layer, wherein the conductive bank layer includes a first metal layer, a second metal layer having a tip protruding from the first metal layer toward a center of the pixel opening, and a cover layer covering the second metal layer.

The opposite electrode may directly contact a side surface of the first metal layer.

A Young's modulus of the cover layer may be greater than a Young's modulus of the second metal layer.

The first metal layer may include molybdenum.

The second metal layer may include titanium, wherein the cover layer includes titanium nitride.

A thickness of the first metal layer may be about 2,500 Å to about 6,000 Å.

A thickness of the second metal layer and the cover layer may be about 500 Å to about 2,000 Å.

The display apparatus may further include a protective layer between the inorganic bank layer and the pixel electrode, and overlapping an edge of the pixel electrode.

The display apparatus may further include an inorganic encapsulation layer above the opposite electrode, and directly contacting a lower surface of the tip of the second metal layer.

The display apparatus may further include a dummy intermediate layer and a dummy opposite electrode above the bank layer, wherein the dummy intermediate layer is separated from the intermediate layer, and wherein the dummy opposite electrode is separated from the opposite electrode by the tip.

According to one or more embodiments, a display apparatus includes a pixel electrode, an organic bank layer defining a pixel opening overlapping the pixel electrode, the organic bank layer covering an edge of the pixel electrode, an auxiliary electrode including a first sub-electrode, a second sub-electrode having a tip protruding outwardly from the first sub-electrode, and a cover electrode covering the second sub-electrode, an intermediate layer covering the organic bank layer and the auxiliary electrode, and an opposite electrode above the intermediate layer.

The opposite electrode may directly contact a side surface of the first sub-electrode.

A Young's modulus of the cover electrode may be greater than a Young's modulus of the second sub-electrode.

The first sub-electrode may include molybdenum.

The second sub-electrode may include titanium, and wherein the cover electrode includes titanium nitride.

A thickness of the first sub-electrode may be about 2,500 Å to about 6,000 Å.

A thickness of the second sub-electrode and the cover electrode may be about 500 Å to about 2,000 Å.

The auxiliary electrode may be above the organic bank layer.

The display apparatus may further include at least one organic insulating layer under the pixel electrode, and defining a recessed portion overlapping the auxiliary electrode, wherein the organic bank layer defines an auxiliary opening overlapping the auxiliary electrode.

The display apparatus may further include a dummy intermediate layer and a dummy opposite electrode above the auxiliary electrode, wherein the dummy intermediate layer is separated from the intermediate layer, and wherein the dummy opposite electrode is separated from the opposite electrode by the tip.

Other aspects than those described above will become apparent from the following drawings, claims, and detailed description of the disclosure.

BRIEF DESCRIPTION OF THE DRAWINGS

The above and other aspects of some embodiments of the disclosure will be more apparent from the following description taken in conjunction with the accompanying drawings, in which.

DETAILED DESCRIPTION

Figure 1:
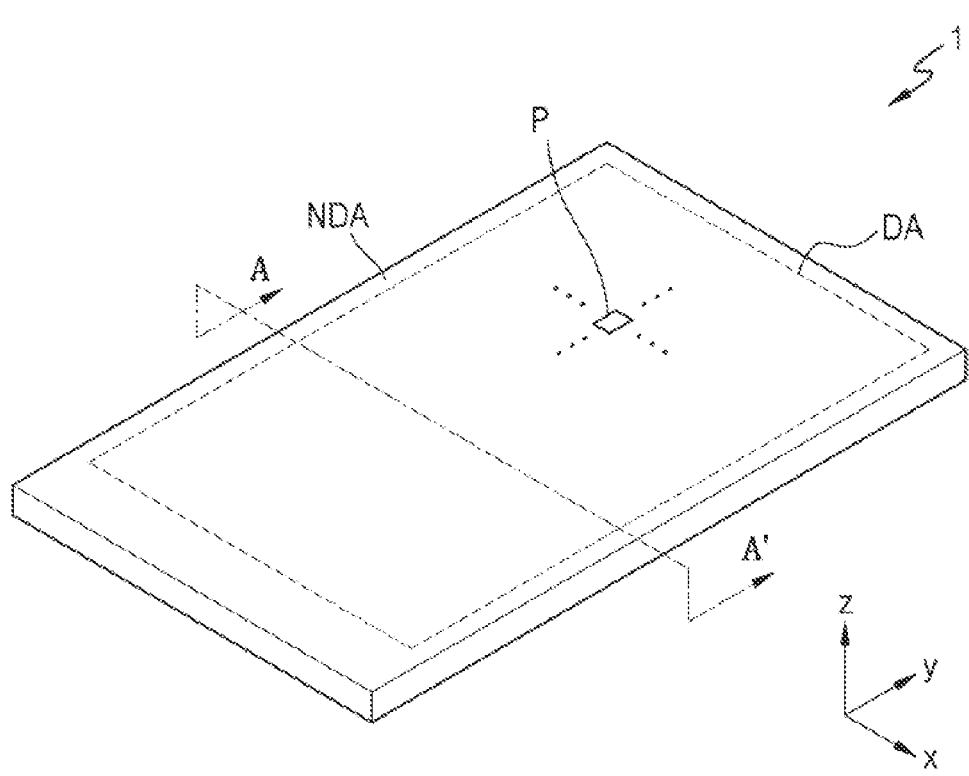
FIG. 1 is a schematic perspective view of a display apparatus according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present embodiments, and particular embodiments will be illustrated in the drawings and described in the detailed description section. The aspects of the present embodiments, and a method to achieve the same, will be clearer referring to the detailed descriptions below with the drawings. However, the present embodiments may be implemented in various forms, not by being limited to the embodiments presented below.

Hereinafter, embodiments will be described in detail with reference to the accompanying drawings, and in the description with reference to the drawings, the same or corresponding constituents are indicated by the same reference numerals and redundant descriptions thereof are omitted.

It will be understood that although the terms "first," "second," etc. may be used herein to describe various components, these components should not be limited by these terms. These terms are only used to distinguish one component from another.

As used herein, the singular forms are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

It will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the specification, the expression such as "A and/or B" may include A, B, or A and B. Furthermore, the expression such as "at least one of A and B" may include A, B, or A and B.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of components in the drawings may be exaggerated for convenience of explanation. For example, since sizes and thicknesses of components in the drawings are arbitrarily illustrated for convenience of explanation, the following embodiments are not limited thereto.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

FIG. 1 is a schematic perspective view of a display apparatus 1 according to one or more embodiments.

Referring to FIG. 1, the display apparatus 1 may include a display area DA, and a non-display area NDA arranged outside the display area DA. The display area DA may display an image through a plurality of pixels P arranged in the display area DA. The non-display area NDA is a non-display area arranged outside the display area DA and where no image is displayed, and may entirely surround (e.g., in plan view) the display area DA. Drivers for providing electrical signals or power to the display area DA and the like may be arranged in the non-display area NDA. A pad, which is an area to which electronic elements, printed circuit boards, or the like may be electrically connected, may be arranged in the non-display area NDA.

In one or more embodiments, although FIG. 1 illustrates that the display area DA is a polygon, for example, a rectangle, in which the length in an x direction is less than the length in a y direction, the disclosure is not limited thereto. In one or more other embodiments, the display area DA may have various shapes, such as polygon/N-gon (where N corresponds to a natural number of three or more), circle, or oval. Although FIG. 1 illustrates that the display area DA has a shape in which a corner portion thereof includes a vertex where two straight lines meet, in one or more other embodiments, the display area DA may be a polygon with a round corner portion.

In the following description, for convenience of explanation, a case in which the display apparatus 1 is an electronic device that is a smart phone is described, but the display apparatus 1 according to one or more embodiments is not limited thereto. The display apparatus 1 may be applied to various products including not only portable electronic devices, such as mobile phones, smart phones, tablet personal computers (PCs), mobile communication terminals, electronic organizers, electronic books, portable multimedia players (PMPs), navigation devices, ultra-mobile PCs (UMPCs), and the like, but also televisions, notebook computers, monitors, billboards, internet of things (IOT), and the like. Furthermore, the display apparatus 1 according to one or more embodiments may be applied to wearable devices, such as smart watches, watch phones, glasses type displays, and head mounted displays (HMDs).

Furthermore, the display apparatus 1 according to one or more embodiments may be applied to an instrument panel of a vehicle, and a center information display (CID) arranged in a center fascia or dashboard of a vehicle, a room mirror display in lieu of a side mirror of a vehicle, and a display screen arranged on the backside of the front seat as an entertainment for the rear seat of a vehicle.

Figure 2:
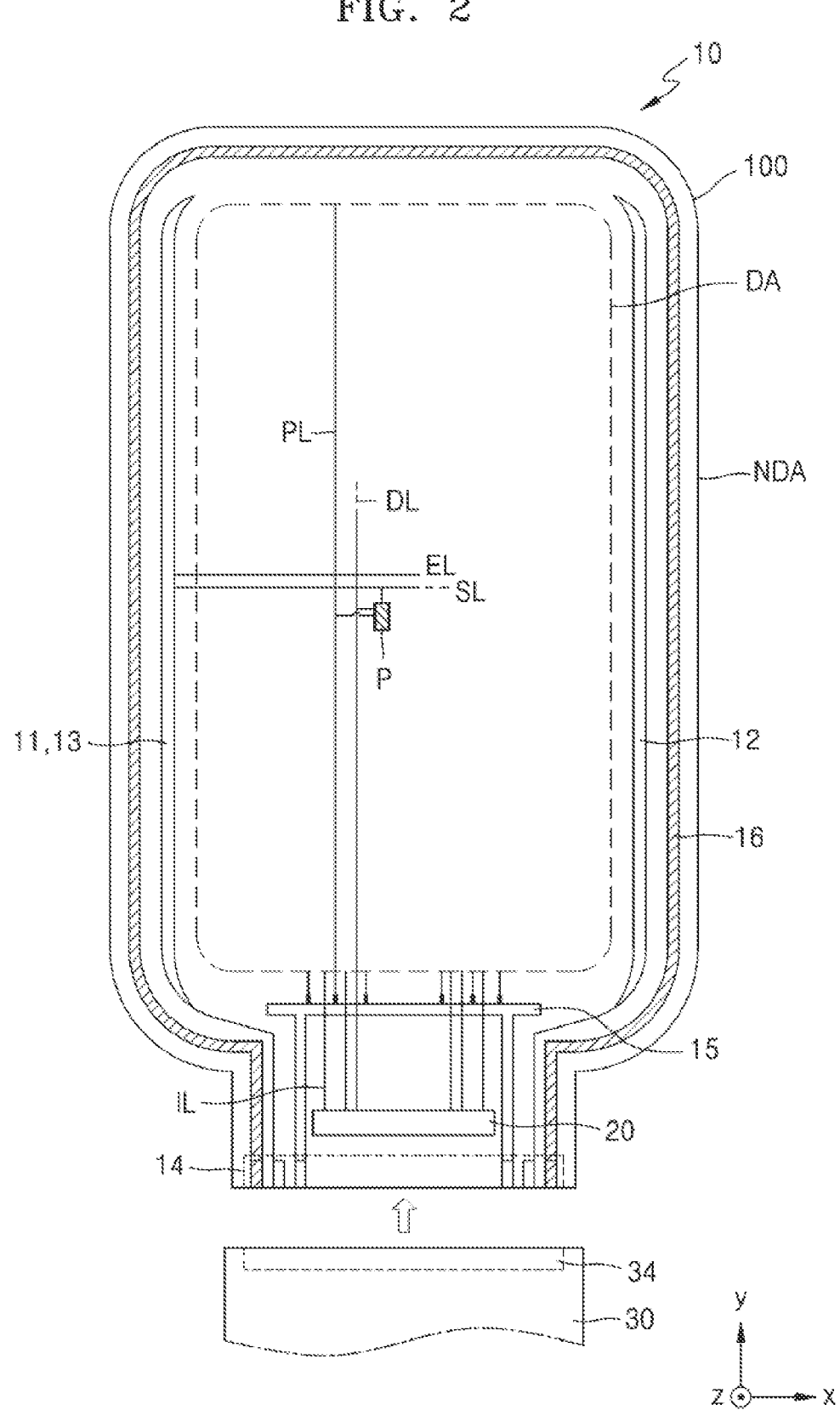
FIG. 2 is a schematic plan view of a display panel included in a display apparatus according to one or more embodiments.

FIG. 2 is a schematic plan view of a display panel 10 included in a display apparatus according to one or more embodiments.

Referring to FIG. 2, the display panel 10 may include the display area DA, and the non-display area NDA arranged outside the display area DA. The display area DA is a portion for displaying an image, and the pixels P may be arranged in the display area DA. Although FIG. 2 illustrates that the display area DA has an approximately rectangular shape with a round corner, the disclosure is not limited thereto. As described above, the display area DA may have various shapes, such as polygonal/N-gonal (where N corresponds to a natural number of three or more), circular, and oval shapes.

Each of the pixels P means a sub-pixel, and may include a display element, such as an organic light-emitting diode (OLED). Each of the pixels P may emit, for example, red, green, blue, or white light.

The non-display area NDA may be arranged outside the display area DA. Outside circuits for driving each of the pixels P may be arranged in the non-display area NDA. For example, a first scan driving circuit 11, a second scan driving circuit 12, an emission control driving circuit 13, a terminal 14, a driving power supply line 15, and a common power supply line 16 may be arranged in the non-display area NDA. The first scan driving circuit 11 may provide a scan signal to each of the pixels P through a scan line SL. The second scan driving circuit 12 may be arranged parallel to the first scan driving circuit 11 with the display area DA therebetween. Some of the pixels P arranged in the display area DA may be electrically connected to the first scan driving circuit 11, and the other pixels P may be connected to the second scan driving circuit 12. The second scan driving circuit 12 may be omitted in one or more embodiments, and the pixels P arranged in the display area DA may all be electrically connected to the first scan driving circuit 11.

The emission control driving circuit 13 is arranged at the side of the first scan driving circuit 11, and may provide an emission control signal to each of the pixels P through an emission control line EL. Although FIG. 1 illustrates that the emission control driving circuit 13 is arranged only in one side of the display area DA, the emission control driving circuit 13 may be arranged in both sides of the display area DA like the first scan driving circuit 11 and the second scan driving circuit 12.

A driving chip 20 may be arranged in the non-display area NDA. The driving chip 20 may include an integrated circuit for driving the display panel 10. The integrated circuit may be a data driving integrated circuit for generating a data signal, but the disclosure is not limited thereto.

The terminal 14 may be arranged in the non-display area NDA. The terminal 14 that is exposed and that is not covered with an insulating layer may be electrically connected to a printed circuit board 30. A terminal 34 of the printed circuit board 30 may be electrically connected to the terminal 14 of the display panel 10.

The printed circuit board 30 sends a signal or power of a control unit (not shown) to the display panel 10. A control signal generated by the control unit may be sent to each of driving circuits through the printed circuit board 30. Furthermore, the control unit may send a driving voltage ELVDD to the driving power supply line 15, and may send a common voltage ELVSS to the common power supply line 16. The driving voltage ELVDD may be sent to each of the pixels P through a driving voltage line PL connected to the driving power supply line 15, and the common voltage ELVSS may be sent to a opposite electrode of each of the pixels P through a conductive bank layer 320 (see FIG. 5) connected to the common power supply line 16. The driving power supply line 15 may have a shape extending in one direction (e.g., an X direction) under the display area DA. The common power supply line 16 may have a loop shape having one open side and partially surrounding (e.g., in plan view) the display area DA.

The control unit may generate a data signal, and the generated data signal may be sent to an input line IL through the driving chip 20, and to each of the pixels P through a data line DL connected to the input line IL. For reference, a "line" may mean a "wiring," which may be the same as in embodiments and modifications thereof described below.

Figure 3:
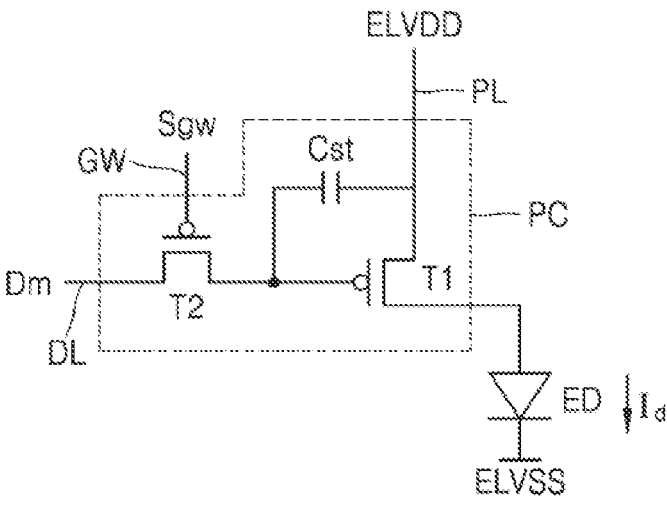
FIGS. 3 and 4 are equivalent circuit diagrams of a pixel included in a display apparatus according to one or more embodiments.
Figure 4:
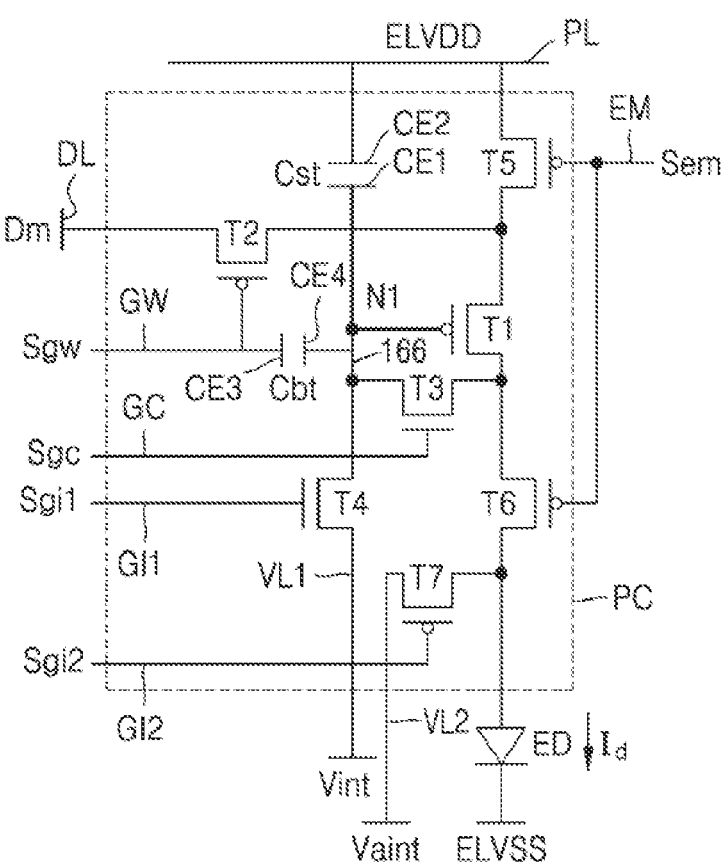

FIGS. 3 and 4 are equivalent circuit diagrams of a pixel included in a display apparatus according to one or more embodiments.

Referring to FIG. 3, a light-emitting diode ED is electrically connected to a pixel circuit PC, and the pixel circuit PC may include a first transistor T1, a second transistor T2, and a storage capacitor Cst.

The second transistor T2 is configured to send a data signal Dm input through the data line DL to the first transistor T1 in response to a scan signal Sgw input through a scan line GW.

The storage capacitor Cst is connected to the second transistor T2 and the driving voltage line PL, and stores a voltage corresponding to a difference between a voltage received from the second transistor T2 and the driving voltage ELVDD supplied through the driving voltage line PL.

The first transistor T1 is connected to the driving voltage line PL and the storage capacitor Cst, and may be configured to control a driving current Id flowing in the light-emitting diode ED from the driving voltage line PL corresponding to a voltage value stored in the storage capacitor Cst. An opposite electrode (for example, a cathode) of the light-emitting diode ED may receive the common voltage ELVSS. The light-emitting diode ED may emit light having a corresponding luminance by the driving current Id.

Although FIG. 3 illustrates a case in which the pixel circuit PC includes two transistors and one storage thin film transistor, the disclosure is not limited thereto.

Referring to FIG. 4, the pixel circuit PC may include seven transistors and two capacitors.

The pixel circuit PC may include first to seventh transistors T1, T2, T3, T4, T5, T6, and T7, a storage capacitor Cst, and a boost capacitor Cbt. In one or more other embodiments, the pixel circuit PC may omit the boost capacitor Cbt.

Some of the first to seventh transistors T1, T2, T3, T4, T5, T6, and T7 may be n-channel MOSFETs (NMOS), and one or more others thereof may be p-channel MOSFETs (PMOS). In one or more other embodiments, the third, fourth, and seventh transistors T3, T4, and T7 may be n-channel MOSFETs (NMOS), and the other transistors may be p-channel MOSFETs (PMOS).

The first to seventh transistors T1, T2, T3, T4, T5, T6, and T7, the storage capacitor Cst, and the boost capacitor Cbt may be connected to a respective signal line. The signal line may include the scan line GW, an emission control line EM, a compensation gate line GC, a first initialization gate line GI1, a second initialization gate line GI2, and/or the data line DL. The pixel circuit PC may be electrically connected to a voltage line, for example, the driving voltage line PL, a first initialization voltage line VL1, and a second initialization voltage line VL2.

The first transistor T1 may be a drive transistor. A first gate electrode of the first transistor T1 is connected to the storage capacitor Cst, a first electrode of the first transistor T1 is electrically connected to the driving voltage line PL via the fifth transistor T5, and a second electrode of the first transistor T1 may be electrically connected to a pixel electrode (for example, an anode) of the light-emitting diode ED via the sixth transistor T6. One of the first electrode and the second electrode of the first transistor T1 may be a source electrode, and the other may be a drain electrode. The first transistor T1 may be configured to supply the driving current Id to the light-emitting diode ED according to a switching operation of the second transistor T2.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and is electrically connected to the driving voltage line PL via the fifth transistor T5. One of the first electrode and the second electrode of the second transistor T2 may be a source electrode, and the other may be a drain electrode. The second transistor T2 may be configured to be turned on in response to the scan signal Sgw received through the scan line GW, and may be configured to perform a switching operation of sending the data signal Dm sent through the data line DL to the first electrode of the first transistor T1.

The third transistor T3 may be a compensation transistor for compensating a threshold voltage of the first transistor T1. A third gate electrode of the third transistor T3 is connected to the compensation gate line GC. A first electrode of the third transistor T3 is connected to a lower electrode CE1 of the storage capacitor Cst and to a first gate electrode of the first transistor T1 through a node connection line 166. The first electrode of the third transistor T3 may be connected to the fourth transistor T4. A second electrode of the third transistor T3 is connected to the second electrode of the first transistor T1, and is electrically connected to the pixel electrode (for example, an anode) of the light-emitting diode ED via the sixth transistor T6. One of the first electrode and the second electrode of the third transistor T3 may be a source electrode, and the other may be a drain electrode.

The third transistor T3 may be configured to turned on in response to a compensation signal Sgc received through the compensation gate line GC, and may electrically connect the first gate electrode and the second electrode (for example, a drain electrode) of the first transistor T1 to each other, thereby diode-connecting the first transistor T1.

The fourth transistor T4 may be a first initialization transistor to initialize the first gate electrode of the first transistor T1. A fourth gate electrode of the fourth transistor T4 is connected to the first initialization gate line GI1. A first electrode of the fourth transistor T4 is connected to the first initialization voltage line VL1. A second electrode of the fourth transistor T4 may be connected to the lower electrode CE1 of the storage capacitor Cst, to the first electrode of the third transistor T3, and to the first gate electrode of the first transistor T1. One of the first electrode and the second electrode of the fourth transistor T4 may be a source electrode, and the other may be a drain electrode. The fourth transistor T4 may be configured to be turned on in response to a first initialization signal Sgi1 received through the first initialization gate line GI1, and may send a first initialization voltage Vint to the first gate electrode of the first transistor T1, thereby performing an initialization operation to initialize the voltage of the first gate electrode of the first transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and to the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and to the second electrode of the third transistor T3, and a second electrode of the sixth transistor T6 is electrically connected to a second electrode of the seventh transistor T7 and to the pixel electrode (for example, an anode) of the light-emitting diode ED. One of the first electrode and the second electrode of the sixth transistor T6 may be a source electrode, and the other may be a drain electrode.

The fifth transistor T5 and the sixth transistor T6 may be configured to be concurrently or substantially simultaneously turned on in response to an emission control signal Sem received through the emission control line EM, and may send the driving voltage ELVDD to the light-emitting diode ED, thereby allowing the driving current Id to flow in the light-emitting diode ED.

The seventh transistor T7 may be a second initialization transistor that initializes the pixel electrode (for example, an anode) of the light-emitting diode ED. A seventh gate electrode of the seventh transistor T7 is connected to the second initialization gate line GI2. A first electrode of the seventh transistor T7 is connected to the second initialization voltage line VL2. A second electrode of the seventh transistor T7 is connected to the second electrode of the sixth transistor T6 and to the pixel electrode (for example, an anode) of the light-emitting diode ED. The seventh transistor T7 may be configured to be turned on in response to a second initialization signal Sgi2 received through the second initialization gate line GI2, and may send a second initialization voltage Vaint to the pixel electrode (for example, an anode) of the light-emitting diode ED, thereby initializing the pixel electrode of the light-emitting diode ED.

In some embodiments, the second initialization gate line GI2 may serve as a subsequent scan line. For example, the second initialization gate line GI2 connected to the seventh transistor T7 of the pixel circuit PC arranged in the i-th row, where "i" is a natural number, may correspond to a scan line of the pixel circuit PC arranged in the (i+1)th row. In one or more other embodiments, the second initialization gate line GI2 may serve as the emission control line EM. For example, the emission control line EM may be electrically connected to the fifth to seventh transistors T5, T6, and T7.

The storage capacitor Cst may include the lower electrode CE1 and an opposite electrode CE2. The lower electrode CE1 of the storage capacitor Cst is connected to the first gate electrode of the first transistor T1, and the opposite electrode CE2 of the storage capacitor Cst is connected to the driving voltage line PL. The storage capacitor Cst may store electric charges corresponding to a difference between the voltage of the first gate electrode of the first transistor T1 and the driving voltage ELVDD.

The boost capacitor Cbt may include a third electrode CE3 and a fourth electrode CE4. The third electrode CE3 is connected to the second gate electrode of the second transistor T2 and to the scan line GW, and the fourth electrode CE4 may be connected to the first electrode of the third transistor T3 and to the node connection line 166. The boost capacitor Cbt may increase a voltage of a first node N1 when the scan signal Sgw supplied through the scan line GW is turned off, and when the voltage of the first node N1 is increased, black gradation may be clearly expressed.

The first node N1 may be an area where the first gate electrode of the first transistor T1, the first electrode of the third transistor T3, the second electrode of the fourth transistor T4, and the fourth electrode CE4 of the boost capacitor Cbt are connected to one another.

In one or more embodiments, and as shown in FIG. 4, the third and fourth transistors T3 and T4 are n-channel MOS-FETs (NMOS), and the first, second, fifth, sixth, and seventh transistors T1, T2, T5, T6, and T7 are p-channel MOSFETs (PMOS). The first transistor T1 that directly affects the brightness of a display apparatus for displaying an image is configured to include a semiconductor layer including polycrystalline silicon having high reliability, and accordingly, a high-resolution display apparatus may be implemented.

Figure 5:
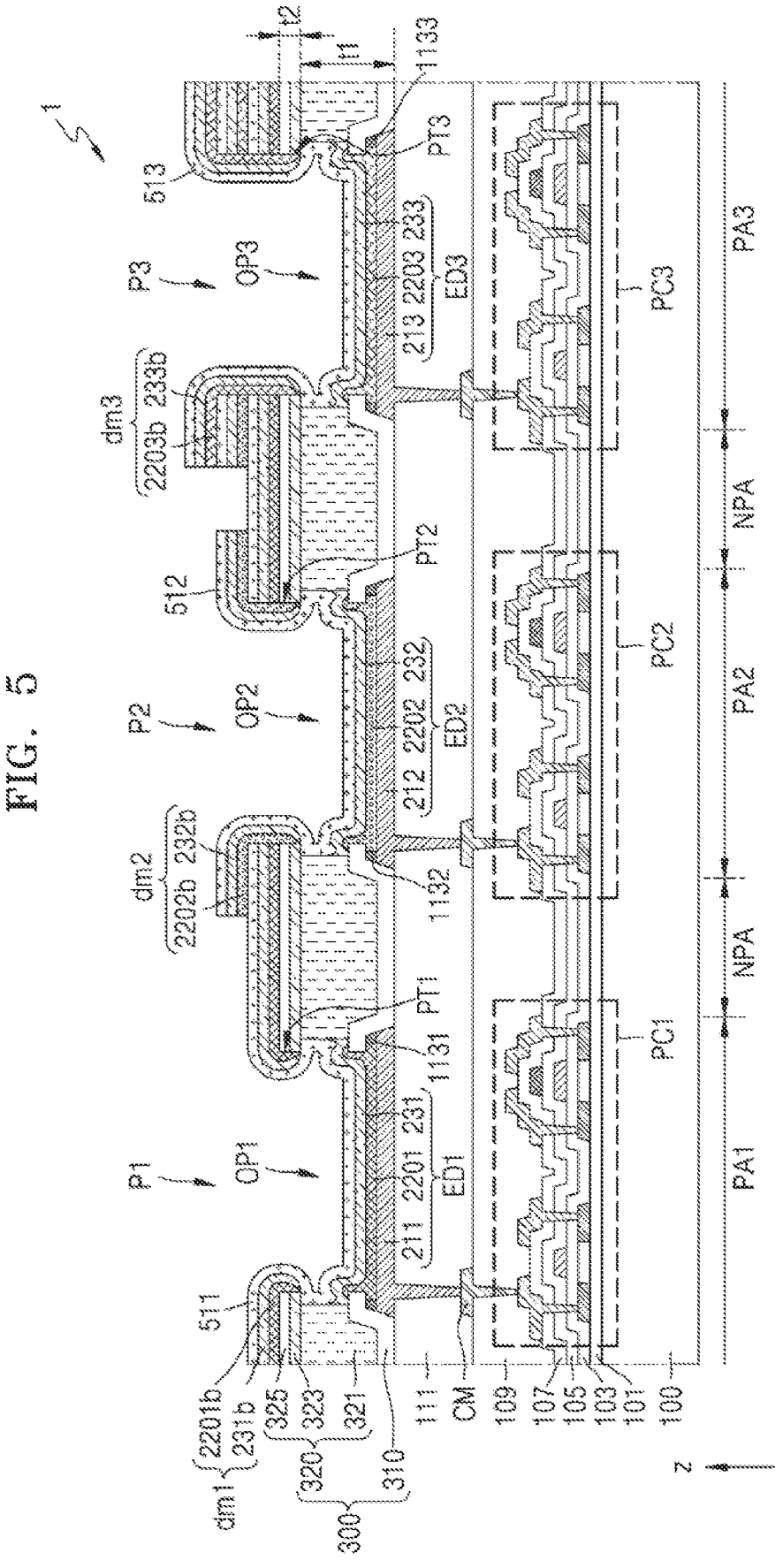
FIG. 5 is a schematic cross-sectional view of a display apparatus according to one or more embodiments.
Figure 6:
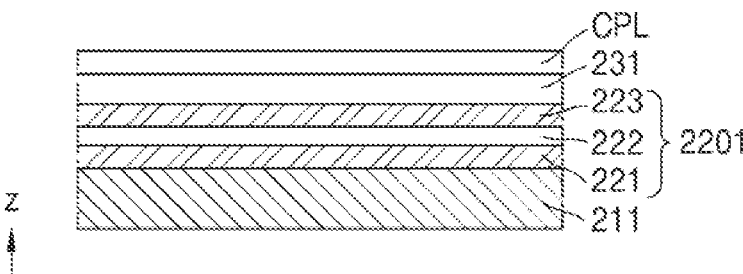
FIG. 6 is a schematic cross-sectional view of a stacked structure of a light-emitting diode included in the display apparatus of FIG. 5.

FIG. 5 is a schematic cross-sectional view of a display apparatus according to one or more embodiments. FIG. 6 is a schematic cross-sectional view of a stacked structure of a light-emitting diode included in the display apparatus of FIG. 5.

Referring to FIG. 5, a substrate 100 may include a first pixel area PA1 in which a first pixel P1 is located, a second pixel area PA2 in which a second pixel P2 is located, a third pixel area PA3 in which a third pixel P3 is located, and a non-pixel area NPA.

The substrate 100 may include glass material or polymer resin. The substrate 100 may have a structure in which a base layer including polymer resin and an inorganic barrier layer area stacked. The polymer resin may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate, cellulose triacetate (TAC), and/or cellulose acetate propionate (CAP).

A buffer layer 101 may be located on an upper surface of the substrate 100. The buffer layer 101 may reduce or prevent the likelihood of impurities infiltrating into a semiconductor layer of a transistor. The buffer layer 101 may include an inorganic insulating material, such as silicon nitride, silicon oxynitride, or silicon oxide, and may be a single layer or multilayer including the aforementioned inorganic insulating material.

A first pixel circuit PC1, a second pixel circuit PC2, and a third pixel circuit PC3 may be located on the buffer layer 101. Each of the first pixel circuit PC1, the second pixel circuit PC2, and the third pixel circuit PC3 may include a plurality of transistors and a storage capacitor, as shown in FIG. 3 or 4. In one or more embodiments, FIG. 5 illustrates the first transistor T1, the sixth transistor T6, and the storage capacitor Cst of the pixel circuit PC described with reference to FIG. 4. The first pixel circuit PC1, the second pixel circuit PC2, and the third pixel circuit PC3 may have the same configuration or similar configurations.

The first transistor T1 may include a first semiconductor layer A1 on the buffer layer 101, and a first gate electrode G1 overlapping a channel region of the first semiconductor layer A1. The first semiconductor layer A1 may include a silicon-based semiconductor material, for example, polysilicon. The first semiconductor layer A1 may include the channel region, and a first region and a second region arranged at respective sides of the channel region. The first region and the second region are regions including impurities having a higher concentration than that of the channel region, and any one of the first region and the second region may correspond to a source region while the other may correspond to a drain region.

The sixth transistor T6 may include a sixth semiconductor layer A6 on the buffer layer 101, and a sixth gate electrode G6 overlapping the channel region of the sixth semiconductor layer A6. The sixth semiconductor layer A6 may include a silicon-based semiconductor material, for example, polysilicon. The sixth semiconductor layer A6 may include a channel region, and a first region and a second region arranged at respective sides of the channel region. The first region and the second region are regions including impurities having a higher concentration than that of the channel region, and any one of the first region and the second region may correspond to a source region while the other may correspond to a drain region.

The first gate electrode G1 and the sixth gate electrode G6 may each include a conductive material including molybdenum (Mo), aluminum (Al), copper (Cu), titanium (Ti), or the like, and may have a single-layered or multi-layered structure including the aforementioned material. A first gate-insulating layer 103 for electrical insulation from the first semiconductor layer A1 and the sixth semiconductor layer A6 may be arranged below the first gate electrode G1 and the sixth gate electrode G6. The first gate-insulating layer 103 may include an inorganic insulating material, such as silicon nitride, silicon oxynitride, or silicon oxide, and may be a single layer or multilayer including the aforementioned inorganic insulating material.

The storage capacitor Cst may include the lower electrode CE1 and the opposite electrode CE2 overlapping each other. In one or more embodiments, the lower electrode CE1 of the storage capacitor Cst may include the first gate electrode G1. In other words, the first gate electrode G1 may include the lower electrode CE1 of the storage capacitor Cst. For example, the first gate electrode G1 and the lower electrode CE1 of the storage capacitor Cst may be integrally formed.

A first interlayer insulating layer 105 may be arranged between the lower electrode CE1 and the opposite electrode CE2 of the storage capacitor Cst. The first interlayer insulating layer 105 may include an inorganic insulating material, such as silicon oxide, silicon nitride, or silicon oxynitride, and may have a single-layered or multi-layered structure including the aforementioned inorganic insulating material.

The opposite electrode CE2 of the storage capacitor Cst may include a low-resistance conductive material, such as Mo, Al, Cu, and/or Ti, and may have a single-layered or multi-layered structure including the aforementioned material.

A second interlayer insulating layer 107 may be located on the storage capacitor Cst. The second interlayer insulating layer 107 may include an inorganic insulating material, such as silicon oxide, silicon nitride, or silicon oxynitride, and may have a single-layered or multi-layered structure including the aforementioned inorganic insulating material.

A source electrode S1 and/or a drain electrode D1 electrically connected to the first semiconductor layer A1 of the first transistor T1 may be located on the second interlayer insulating layer 107. A source electrode S6 and/or a drain electrode D6 electrically connected to the sixth semiconductor layer A6 of the sixth transistor T6 may be located on the second interlayer insulating layer 107. The source electrodes S1 and S6 and/or the drain electrodes D1 and D6 may each include Al, Cu, and/or Ti, and may be in a single layer or multilayer including the aforementioned material.

A first organic insulating layer 109 may be located on the pixel circuit PC. The first organic insulating layer 109 may include an organic insulating material, such as acryl, benzocyclobutene (BCB), polyimide, hexamethyldisiloxane (HMDSO), or the like.

A connection metal CM may be located on the first organic insulating layer 109. The connection metal CM may include Al, Cu, and/or Ti, and may be in a single layer or multilayer including the aforementioned material.

A second organic insulating layer 111 may be arranged between the connection metal CM and the first pixel electrode 211, the second pixel electrode 212, and the third pixel electrode 213. The second organic insulating layer 111 may include an organic insulating material, such as acryl, BCB, polyimide, HMDSO, or the like.

According to the embodiments corresponding to FIG. 5, the first pixel circuit PC1 and the first pixel electrode 211 are electrically connected to each other through the connection metal CM. Further, the second pixel circuit PC2 and the second pixel electrode 212 are electrically connected to each other through the connection metal CM. Also, the third pixel circuit PC3 and the third pixel electrode 213 are electrically connected to each other through the connection metal CM. According to one or more other embodiments, the connection metal CM may be omitted. For example, one organic insulating layer may be located between the first pixel circuit PC1, the second pixel circuit PC2, and the third pixel circuit PC3, and the first pixel electrode 211, the second pixel electrode 212, and the third pixel electrode 213. Alternatively, three or more organic insulating layers may be located between the first pixel circuit PC1, the second pixel circuit PC2, and the third pixel circuit PC3, and the first pixel electrode 211, the second pixel electrode 212, and the third pixel electrode 213. In this case, the first pixel circuit PC1 and the first pixel electrode 211 may be electrically connected to each other through a plurality of connection metals, the second pixel circuit PC2 and the second pixel electrode 212 may be electrically connected to each other through a plurality of connection metals, and the third pixel circuit PC3 and the third pixel electrode 213 may be electrically connected to each other through a plurality of connection metals.

The first pixel electrode 211, the second pixel electrode 212, and the third pixel electrode 213 may be formed on the second organic insulating layer 111. The first pixel electrode 211 may be located in the first pixel area PA1, the second pixel electrode 212 may be located in the second pixel area PA2, and the third pixel electrode 213 may be located in the third pixel area PA3. The non-pixel area NPA may be located between the first pixel area PA1, the second pixel area PA2, and the third pixel area PA3.

The first pixel electrode 211, the second pixel electrode 212, and the third pixel electrode 213 may be (semi-)transparent electrodes or reflective electrodes. When the first pixel electrode 211, the second pixel electrode 212, and the third pixel electrode 213 are (semi-)transparent electrodes, the first pixel electrode 211, the second pixel electrode 212, and the third pixel electrode 213 may each include, for example, indium tin oxide (ITO), indium zinc oxide (IZO), zinc oxide (ZnO), indium oxide ($In_2O_3$), indium gallium oxide (IGO), or aluminum zinc oxide (AZO). When the first pixel electrode 211, the second pixel electrode 212, and the third pixel electrode 213 are reflective electrodes, a reflective layer may be formed using Ag, Mg, Al, Pt, Pd, Au, Ni, Nd, Ir, Cr, or a compound thereof, and a layer including ITO, IZO, ZnO, or $In_2O_3$ may be formed on the reflective layer. In one or more embodiments, the first pixel electrode 211, the second pixel electrode 212, and the third pixel electrode 213 may have a structure in which an ITO layer, an Ag layer, and an ITO layer are sequentially stacked.

A first protective layer 1131 may be located on the first pixel electrode 211, a second protective layer 1132 may be located on the second pixel electrode 212, and a third protective layer 1133 may be located on the third pixel electrode 213. The first protective layer 1131 may overlap an edge of the first pixel electrode 211, the second protective layer 1132 may overlap an edge of the second pixel electrode 212, and the third protective layer 1133 may overlap an edge of the third pixel electrode 213.

The first protective layer 1131, the second protective layer 1132, and the third protective layer 1133 may be portions remaining after protective layers for reducing or preventing the likelihood of damage to each of the first pixel electrode 211, the second pixel electrode 212, and the third pixel electrode 213 due to a gas or liquid material used in an etching process to form a first pixel opening OP1, a second pixel opening OP2, and/or a third pixel opening OP3 of a bank layer 300 to be described below are removed. The thicknesses of the first protective layer 1131, the second protective layer 1132, and the third protective layer 1133 may be about 250 Å to about 500 Å. However, the disclosure is not limited thereto. In one or more embodiments, the first protective layer 1131, the second protective layer 1132, and the third protective layer 1133 may each include a conductive oxide, such as indium zinc oxide (IZO) and/or indium gallium zinc oxide (IGZO).

The bank layer 300 having the first pixel opening OP1 overlapping the first pixel electrode 211, the second pixel opening OP2 overlapping the second pixel electrode 212, and the third pixel opening OP3 overlapping the third pixel electrode 213 may be located on the second organic insulating layer 111. The first pixel opening OP1 may define an emission area of the first pixel P1, the second pixel opening OP2 may define an emission area of the second pixel P2, and the third pixel opening OP3 may define an emission area of the third pixel P3.

The bank layer 300 may include an inorganic bank layer 310 and a conductive bank layer 320. The inorganic bank layer 310 may cover an edge of the first pixel electrode 211, an edge of the second pixel electrode 212, and an edge of the third pixel electrode 213. The first protective layer 1131 may be between the first pixel electrode 211 and the inorganic bank layer 310, the second protective layer 1132 may be between the second pixel electrode 212 and the inorganic bank layer 310, and the third protective layer 1133 may be between the third pixel electrode 213 and the inorganic bank layer 310. The first protective layer 1131, the second protective layer 1132, the third protective layer 1133, and the inorganic bank layer 310 may increase the distance between the first pixel electrode 211, the second pixel electrode 212, and the third pixel electrode 213 and the conductive bank layer 320 and an opposite electrode of a light-emitting diode, to be described below, to thereby reduce or prevent the likelihood of an arc or the like occurring therebetween.

The inorganic bank layer 310 may include an inorganic insulating material, such as silicon oxide, silicon nitride, or silicon oxynitride, and may have a single-layered or multi-layered structure including the aforementioned inorganic insulating material.

The conductive bank layer 320 may be entirely formed on (e.g., formed to cover an entirety of) the inorganic bank layer 310. In this case, that the conductive bank layer 320 is entirely formed may mean that a material forming the conductive bank layer 320 is formed over the entire surface of the substrate 100 without a separate mask. The conductive bank layer 320 may extend from the display area DA (see FIG. 2) to at least a portion of the non-display area NDA (see FIG. 2), and may be electrically connected to the common power supply line 16 (see FIG. 2).

The conductive bank layer 320 may include a first metal layer 321, a second metal layer 323, and a cover layer 325. The first metal layer 321 and the second metal layer 323 may include different respective metal materials. The first metal layer 321 and the second metal layer 323 may have different etch selectivity. For example, the first metal layer 321 may include Mo, and the second metal layer 323 may include Ti.

In one or more embodiments, a thickness t1 of the first metal layer 321 may be about 2,500 Å to about 6,000 Å. When the thickness t1 of the first metal layer 321 is less than about 2,500 Å, the side surface of the first metal layer 321 forming each of the first pixel opening OP1, the second pixel opening OP2, and the third pixel opening OP3 may be mostly covered by an intermediate layer of the light-emitting diode to be described below, and thus, a first opposite electrode 231, a second opposite electrode 232, and a third opposite electrode 233 may not sufficiently contact the first metal layer 321. In other words, the thickness t1 of the first metal layer 321 may be greater than the thicknesses of a first intermediate layer 2201, a second intermediate layer 2202, and a third intermediate layer 2203. When the thickness t1 of the first metal layer 321 exceeds about 6,000 Å, the thickness of the display apparatus 1 may be unnecessarily increased.

The second metal layer 323 may be located on the first metal layer 321. The second metal layer 323 may have a first tip PT1 protruding from the upper surface of the first metal layer 321 toward the center of the first pixel opening OP1, a second tip PT2 protruding from the upper surface of the first metal layer 321 toward the center of the second pixel opening OP2, and a third tip PT3 protruding from the upper surface of the first metal layer 321 toward the center of the third pixel opening OP3. A protrusion length of each of the first tip PT1, the second tip PT2, and the third tip PT3 protruding from the side surface of the first metal layer 321 may be about 2 μm or less. The protrusion length of each of the first tip PT1, the second tip PT2, and the third tip PT3 protruding from the side surface of the first metal layer 321 may be about 0.3 μm to about 1 μm, or may be about 0.3 μm to about 0.7 μm.

The cover layer 325 may cover an upper surface of the second metal layer 323. The cover layer 325 may include a material having a higher Young's modulus than a material constituting the second metal layer 323. In one or more embodiments, the Young's modulus of the second metal layer 323 may be about 600 GPa or more. For example, when the second metal layer 323 includes Ti, the cover layer 325 may include titanium nitride (TiN). As the cover layer 325 is located on the second metal layer 323, deformation of the first to third tips PT1 to PT3 in a subsequent process, such as cleaning, may be reduced or prevented.

In one or more embodiments, a thickness t2 of the second metal layer 323 and the cover layer 325 from the lower surface of the second metal layer 323 to the upper surface of the cover layer 325 may be about 500 Å to about 2,000 Å. When the thickness t2 of the second metal layer 323 and the cover layer 325 is less than about 500 Å, the first tip PT1, the second tip PT2, and the third tip PT3 may be deformed or lost. When the thickness t2 of the second metal layer 323 and the cover layer 325 exceeds about 2,000 Å, the thickness of the display apparatus 1 may be unnecessarily increased.

The first intermediate layer 2201 may be located on the first pixel electrode 211 through the first pixel opening OP1 of the bank layer 300. As shown in FIG. 6, the first intermediate layer 2201 may include a first emission layer 222. The first intermediate layer 2201 may include one or more functional layers arranged between the first pixel electrode 211 and the first emission layer 222 and/or between the first emission layer 222 and the first opposite electrode 231. Hereinafter, the functional layer between the first pixel electrode 211 and the first emission layer 222 is referred to as a first functional layer 221, and the functional layer between the first emission layer 222 and the first opposite electrode 231 is referred to as a second functional layer 223.

The first emission layer 222 may include a high molecular weight or low molecular weight organic material that emits light of a corresponding color (red, green, or blue). In one or more other embodiments, the first emission layer 222 may include an inorganic material or quantum dots.

The first functional layer 221 may include a hole transport layer (HTL) and/or a hole injection layer (HIL). The second functional layer 223 may include an electron transport layer (ETL) and/or an electron injection layer (EIL). The first functional layer 221 and the second functional layer 223 may include an organic material.

The first emission layer 222 may have a single stack structure including a single emission layer, or a tandem structure that is a multi-stack structure including a plurality of emission layers. When the first emission layer 222 has a tandem structure, a charge generation layer (CGL) may be located between the plurality of stacks.

In one or more embodiments, the first intermediate layer 2201 including the first emission layer 222 may be deposited without a separate mask, and thus, a deposition material for forming the first intermediate layer 2201 may form a first dummy intermediate layer 2201*b* that is continuous from the upper surface of the cover layer 325 overlapping the non-pixel area NPA to the side surface of the first tip PT1. The first intermediate layer 2201 and the first dummy intermediate layer 2201*b* may be separated and spaced apart from each other by the first tip PT1. The first intermediate layer 2201 and the first dummy intermediate layer 2201*b* may include the same material and/or the same number of sub-layers (e.g., a first functional layer, an emission layer, and a second functional layer).

The first opposite electrode 231 may be located on the first intermediate layer 2201 through the first pixel opening OP1 of the bank layer 300. The first opposite electrode 231 may include a conductive material having a low work function. For example, the first opposite electrode 231 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the first opposite electrode 231 may further include a layer including ITO, IZO, ZnO, or $In_2O_3$ on the (semi-) transparent layer including the material described above.

As shown in FIG. 6, a capping layer CPL may be formed on the first opposite electrode 231. The capping layer CPL may be a layer provided to protect the first opposite electrode 231, and may increase light extraction efficiency. The refractive index of the capping layer CPL may be higher than that of the first opposite electrode 231. For example, the refractive index of the capping layer CPL may be about 1.7 to about 1.9. The capping layer CPL may include an organic material, and may additionally include an inorganic material, such as LiF.

The first opposite electrode 231 may be entirely deposited over the entire surface of the substrate 100 without a separate mask. Accordingly, a deposition material for forming the first opposite electrode 231 may form the first dummy opposite electrode 231*b* covering the upper surface of the first dummy intermediate layer 2201*b*. The first dummy intermediate layer 2201*b* and the first dummy opposite electrode 231*b* may overlap each other in the non-pixel area NPA to form a first dummy stack dm1. The first opposite electrode 231 and the first dummy opposite electrode 231*b* may be separated and spaced apart from each other by the first tip PT1. The first opposite electrode 231 and the first dummy opposite electrode 231*b* may include the same material and/or the same number of sub-layers.

In one or more embodiments, the first intermediate layer 2201 may be formed using a thermal evaporation process, and the first opposite electrode 231 may be formed using a sputtering process. The deposition material for forming the first opposite electrode 231 may be incident at an angle compared to the deposition material for forming the first intermediate layer 2201 based on a direction (z direction)

that is substantially perpendicular to the substrate 100. Accordingly, the first opposite electrode 231 may directly contact the side surface of the first metal layer 321 on which the first intermediate layer 2201 is not formed by being covered by the first tip PT1 of the second metal layer 323.

As described above, because the conductive bank layer 320 is electrically connected to the common power supply line 16 (see FIG. 2), the first opposite electrode 231 may receive the common voltage ELVSS through the first metal layer 321.

A first inorganic encapsulation layer 511 may be formed on the first opposite electrode 231 and the first dummy opposite electrode 231*b*. The first inorganic encapsulation layer 511 might not overlap the second pixel area PA2 and the third pixel area PA3. The first inorganic encapsulation layer 511 may include one or more inorganic insulating materials, such as silicon oxide, silicon nitride, silicon oxynitride, aluminum oxide, titanium oxide, tantalum oxide, hafnium oxide, or zinc oxide, and may be formed by a chemical deposition (CVD) method or the like. Because the first inorganic encapsulation layer 511 has relatively excellent step coverage, the first inorganic encapsulation layer 511 may continuously cover the upper surface of the first dummy opposite electrode 231*b*, the lower surface of the first tip PT1 of the second metal layer 323, the side surface of the first metal layer 321 forming the first pixel opening OP1, and the upper surface of the first opposite electrode 231. The first inorganic encapsulation layer 511 may directly contact the lower surface of the first tip PT1 and the side surface of the first metal layer 321, and may form an inorganic contact region. The inorganic contact region may form a closed loop completely surrounding a first light-emitting diode ED1, and may reduce or block a path through which impurities, such as moisture and/or air, penetrate. In addition, the adhesion of the first inorganic encapsulation layer 511 may be improved by the unevenness of the first tip PT1.

A second intermediate layer 2202 may be located on the second pixel electrode 212 through the second pixel opening OP2 of the bank layer 300. The second intermediate layer 2202 may include a second emission layer that emits light in a color different from that of the first emission layer 222. The second intermediate layer 2202 may have a structure similar to that of the first intermediate layer 2201 described with reference to FIG. 6.

The second intermediate layer 2202 including the second emission layer may be deposited without a separate mask, and thus, a deposition material for forming the second intermediate layer 2202 may form a second dummy intermediate layer 2202*b* that is continuous from the upper surface of the first inorganic encapsulation layer 511 overlapping the non-pixel area NPA to the side surface of the second tip PT2. The second intermediate layer 2202 and the second dummy intermediate layer 2202*b* may be separated and spaced apart from each other by the second tip PT2. The second intermediate layer 2202 and the second dummy intermediate layer 2202*b* may include the same material and/or the same number of sub-layers (e.g., a first functional layer, an emission layer, and a second functional layer).

The second opposite electrode 232 may be located on the second intermediate layer 2202 through the second pixel opening OP2 of the bank layer 300. The second opposite electrode 232 may include a conductive material having a low work function. The second opposite electrode 232 may have a configuration that is the same as, or similar to, that of the first opposite electrode 231 described above. As shown in FIG. 6, a capping layer CPL may be formed on the second opposite electrode 232.

The second opposite electrode 232 may be entirely formed on the second intermediate layer 2202 and the second dummy intermediate layer 2202*b*. For example, the second opposite electrode 232 may be entirely deposited over the entire surface of (e.g., may be deposited over an entirety of) the substrate 100 without a separate mask. A deposition material for forming the second opposite electrode 232 may form a second dummy opposite electrode 232*b* covering the upper surface of the second dummy intermediate layer 2202*b*. The second dummy intermediate layer 2202*b* and the second dummy opposite electrode 232*b* may overlap each other in the non-pixel area NPA to form a second dummy stack dm2. The second dummy stack dm2 may be adjacent to the second pixel opening OP2 and the third pixel opening OP3. The second opposite electrode 232 and the second dummy opposite electrode 232*b* may be separated and spaced apart from each other by the second tip PT2. The second opposite electrode 232 and the second dummy opposite electrode 232*b* may include the same material and/or the same number of sub-layers.

The second opposite electrode 232 may directly contact the side surface of the first metal layer 321 on which the second intermediate layer 2202 is not formed by being covered by the second tip PT2 of the second metal layer 323. As described above, because the conductive bank layer 320 is electrically connected to the common power supply line 16 (see FIG. 2), the second opposite electrode 232 may receive the common voltage ELVSS through the first metal layer 321.

A second inorganic encapsulation layer 512 may be formed on the second opposite electrode 232 and the second dummy opposite electrode 232*b*. The second inorganic encapsulation layer 512 might not overlap the first pixel area PA1 and the third pixel area PA3. The second inorganic encapsulation layer 512 may include an inorganic insulating material, and may be formed by a CVD method or the like. Because the second inorganic encapsulation layer 512 has relatively excellent step coverage, the second inorganic encapsulation layer 512 may continuously cover the upper surface of the second dummy opposite electrode 232*b*, the side surfaces of the second dummy stack dm2 and the first dummy stack dm1, the lower surface of the second tip PT2, the side surface of the first metal layer 321 forming the second pixel opening OP2, and the upper surface of the second opposite electrode 232. The second inorganic encapsulation layer 512 may directly contact the lower surface of the second tip PT2 and the side surface of the first metal layer 321, and may form an inorganic contact region. The inorganic contact region may form a closed loop completely surrounding a second light-emitting diode ED2, and may reduce or block a path through which impurities, such as moisture and/or air, penetrate. In addition, the adhesion of the second inorganic encapsulation layer 512 may be improved by the unevenness of the second tip PT2.

A third intermediate layer 2203 may be located on the third pixel electrode 213 through the third pixel opening OP3 of the bank layer 300. The third intermediate layer 2203 may include a third emission layer that emits light in a color that is different from those of the first emission layer 222 and the second emission layer. The third intermediate layer 2203 may have a structure that is similar to that of the first intermediate layer 2201 described with reference to FIG. 6.

The third intermediate layer 2203 including the third emission layer may be deposited without a separate mask, and thus, a deposition material for forming the third intermediate layer 2203 may form a third dummy intermediate layer 2203*b* that is continuous from the upper surface of the second inorganic encapsulation layer 512 overlapping the non-pixel area NPA to the side surface of the third tip PT3. The third intermediate layer 2203 and the third dummy intermediate layer 2203*b* may be separated and spaced apart from each other by the third tip PT3. The third intermediate layer 2203 and the third dummy intermediate layer 2203*b* may include the same material and/or the same number of sub-layers (e.g., a first functional layer, an emission layer, and a second functional layer).

The third opposite electrode 233 may be located on the third intermediate layer 2203 through the third pixel opening OP3 of the bank layer 300. The third opposite electrode 233 may include a conductive material having a low work function. The third opposite electrode 233 may have a configuration that is the same as, or similar to, that of the first opposite electrode 231 described above. As shown in FIG. 6, a capping layer CPL may be formed on the third opposite electrode 233.

The third opposite electrode 233 may be entirely formed on the third intermediate layer 2203 and the third dummy intermediate layer 2203*b*. For example, the third opposite electrode 233 may be entirely deposited over the entire surface of the substrate 100 without a separate mask. A deposition material for forming the third opposite electrode 233 may form a third dummy opposite electrode 233*b* covering the upper surface of the third dummy intermediate layer 2203*b*. The third dummy intermediate layer 2203*b* and the third dummy opposite electrode 233*b* may overlap each other in the non-pixel area NPA to form a third dummy stack dm3. The third dummy stack dm3 may be adjacent to the third pixel opening OP3. The third opposite electrode 233 and the third dummy opposite electrode 233*b* may be separated and spaced apart from each other by the third tip PT3. The third opposite electrode 233 and the third dummy opposite electrode 233*b* may include the same material and/or the same number of sub-layers.

The third opposite electrode 233 may directly contact the side surface of the first metal layer 321 on which the third intermediate layer 2203 is not formed by being covered by the third tip PT3 of the second metal layer 323. As described above, because the conductive bank layer 320 is electrically connected to the common power supply line 16 (see FIG. 2), the third opposite electrode 233 may receive the common voltage ELVSS through the first metal layer 321.

A third inorganic encapsulation layer 513 may be formed on the third opposite electrode 233 and the third dummy opposite electrode 233*b*. The third inorganic encapsulation layer 513 might not overlap the first pixel area PA1 and the second pixel area PA2. The third inorganic encapsulation layer 513 may include an inorganic insulating material, and may be formed by a CVD method or the like. Because the third inorganic encapsulation layer 513 has relatively excellent step coverage, the third inorganic encapsulation layer 513 may continuously cover the upper surface of the third dummy opposite electrode 233*b*, the side surfaces of the third dummy stack dm3, the side surface of the first metal layer 321 forming the third pixel opening OP3, and the upper surface of the third opposite electrode 233. The third inorganic encapsulation layer 513 may directly contact the lower surface of the third tip PT3 and the side surface of the first metal layer 321, and may form an inorganic contact region. The inorganic contact region may form a closed loop completely surrounding a third light-emitting diode ED3 and reduce or block a path through which impurities, such as moisture and/or air, penetrate. In addition, the adhesion of the third inorganic encapsulation layer 513 may be improved by the unevenness of the third tip PT3.

Although FIG. 5 illustrates that some of the first dummy stack dm1, the second dummy stack dm2, and the third dummy stack dm3 overlap each other in the non-pixel area NPA, the disclosure is not limited thereto. In one or more embodiments, various changes may be made, such as the first dummy stack dm1, the second dummy stack dm2, and the third dummy stack dm3 may be apart from each other.

As described above, in one or more embodiments, the conductive bank layer 320 has an undercut structure. For example, the second metal layer 323 may have a first tip PT1, a second tip PT2, and a third tip PT3, which protrude from the side of the first metal layer 321 forming the first pixel opening OP1, the second pixel opening OP2, and the third pixel opening OP3. Accordingly, the undercut structure of the conductive bank layer 320 may function as a type of mask. Accordingly, without using a separate mask, the first intermediate layer 2201 corresponding to the first pixel electrode 211, the second intermediate layer 2202 corresponding to the second pixel electrode 212, and the third intermediate layer 2203 corresponding to the third pixel electrode 213 may be formed.

The first opposite electrode 231, the second opposite electrode 232, and the third opposite electrode 233 may directly contact the side surface of the first metal layer 321, and may receive the common voltage ELVSS. As a comparative example, when the first metal layer 321 includes Al, aluminum oxide may be formed on the side surface of the first metal layer 321 forming the first pixel opening OP1, the second pixel opening OP2, and the third pixel opening OP3, and thus, the side surface of the first metal layer 321 has high contact resistance. On the other hand, the first metal layer 321 may include Mo. Molybdenum oxide may have a relatively low contact resistance, and may be suitably removed through a cleaning process. Accordingly, because the first metal layer 321 includes Mo, contact resistance between the first metal layer 321 and the first opposite electrode 231, the second opposite electrode 232, and the third opposite electrode 233 may be reduced.

Figure 7:
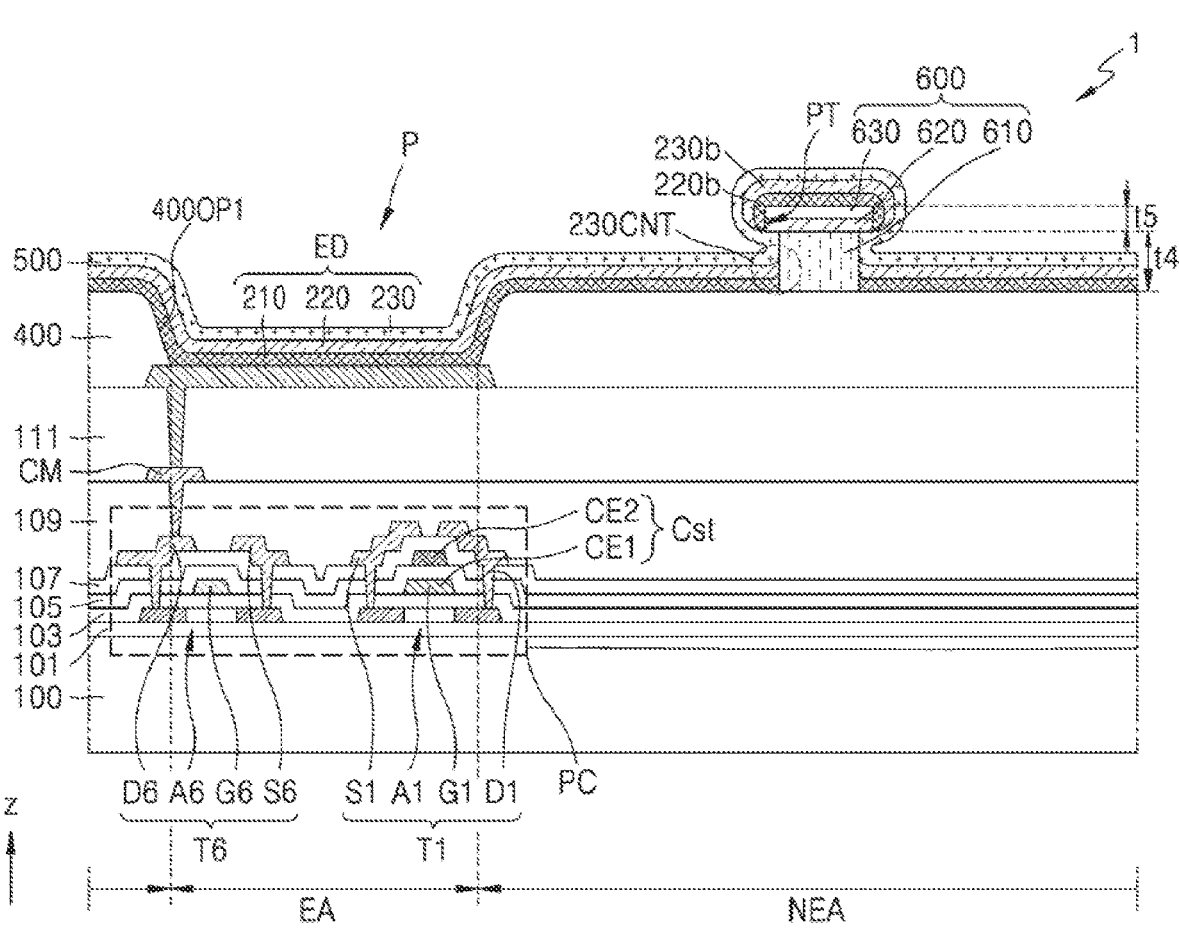
FIGS. 7 and 8 are schematic cross-sectional views of a display apparatus according to one or more embodiments.
Figure 8:
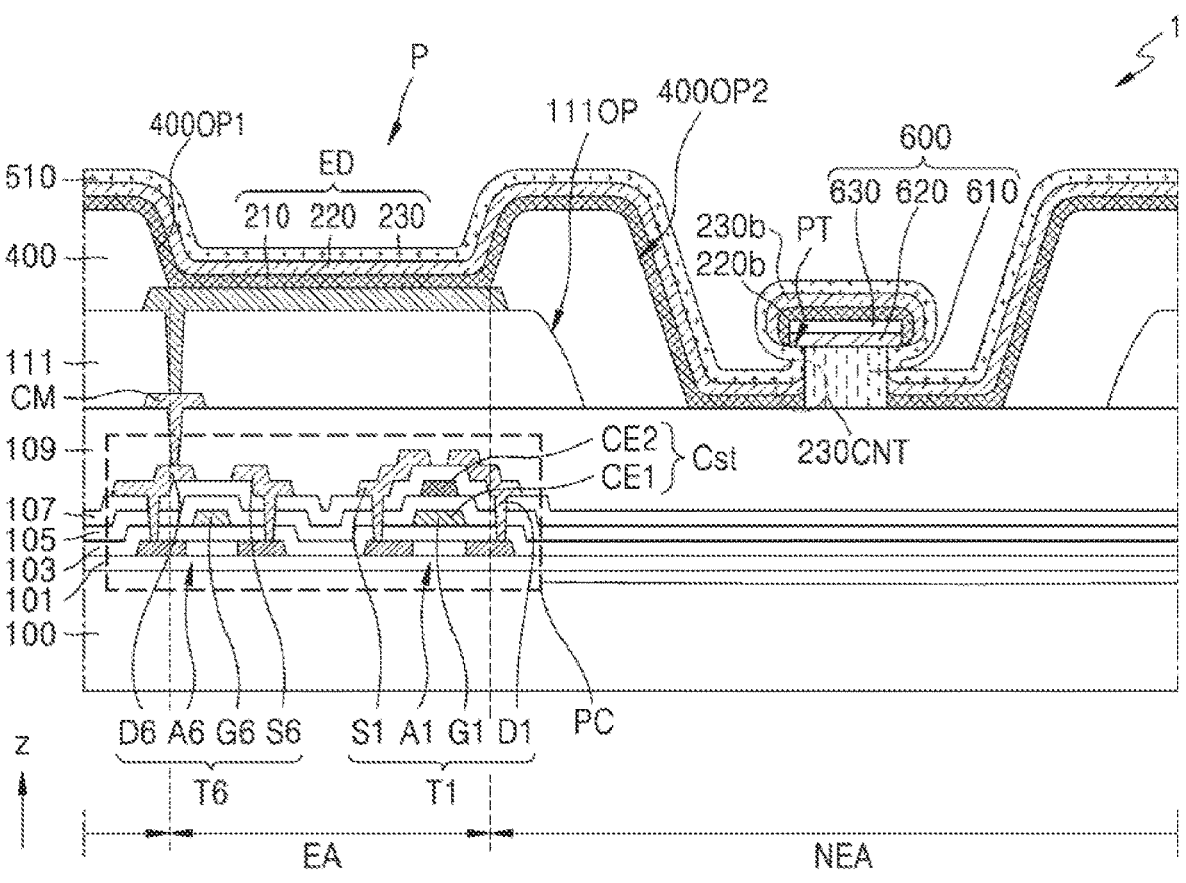

FIGS. 7 and 8 are schematic cross-sectional views of a display apparatus according to one or more embodiments.

Referring to FIG. 7, a pixel P including a pixel circuit PC, and a light-emitting diode ED electrically connected to the pixel circuit PC, is located on a substrate 100.

The substrate 100 may include a glass material or a polymer resin.

A buffer layer 101 may be located on the upper surface of the substrate 100. The buffer layer 101 may reduce or prevent impurities infiltrating into a semiconductor layer of a transistor. The buffer layer 101 may include an inorganic insulating material, such as silicon nitride, silicon oxynitride, or silicon oxide, and may be a single layer or multilayer including the aforementioned inorganic insulating material.

The pixel circuit PC may be located on the buffer layer 101. The pixel circuit PC may include a plurality of transistors and a storage capacitor, as shown in FIG. 3 or 4. FIG. 7 illustrates the first transistor T1, the sixth transistor T6, and the storage capacitor Cst of the pixel circuit PC described with reference to FIG. 4.

The first transistor T1 may include a first semiconductor layer A1 on the buffer layer 101, and a first gate electrode G1 overlapping a channel region of the first semiconductor layer A1. The sixth transistor T6 may include a sixth semiconductor layer A6 on the buffer layer 101, and a sixth gate electrode G6 overlapping a channel region of the sixth semiconductor layer A6. The first gate electrode G1 and the sixth gate electrode G6 may each include a conductive material including Mo, Al, Cu, Ti, or the like, and may each have a single-layered or multi-layered structure including the aforementioned material.

A first gate-insulating layer 103 for electrical insulation from the first semiconductor layer A1 and the sixth semiconductor layer A6 may be located under the first gate electrode G1 and the sixth gate electrode G6. The first gate-insulating layer 103 may include an inorganic insulating material, such as silicon nitride, silicon oxynitride, or silicon oxide, and may be a single layer or multilayer including the aforementioned inorganic insulating material.

The storage capacitor Cst may include a lower electrode CE1 and an opposite electrode CE2 overlapping each other. In one or more embodiments, the lower electrode CE1 of the storage capacitor Cst may include a first gate electrode G1.

A first interlayer insulating layer 105 may be arranged between the lower electrode CE1 and the opposite electrode CE2 of the storage capacitor Cst. The first interlayer insulating layer 105 may include an inorganic insulating material, such as silicon oxide, silicon nitride, or silicon oxynitride, and may have a single-layered or multi-layered structure including the aforementioned inorganic insulating material.

A second interlayer insulating layer 107 may be located on the storage capacitor Cst. The second interlayer insulating layer 107 may include an inorganic insulating material, such as silicon oxide, silicon nitride, or silicon oxynitride, and may have a single-layered or multi-layered structure including the aforementioned inorganic insulating material.

A source electrode S1 and/or a drain electrode D1 electrically connected to the first semiconductor layer A1 of the first transistor T1 may be located on the second interlayer insulating layer 107. The source electrodes S1 and S6 and/or the drain electrodes D1 and D6 may each include Al, Cu, and/or Ti, and may include a single layer or multilayer including the aforementioned material.

A first organic insulating layer 109 may be located on the pixel circuit PC. The first organic insulating layer 109 may include an organic insulating material, such as acryl, BCB, polyimide, HMDSO, or the like.

A connection metal CM may be located on the first organic insulating layer 109. The connection metal CM may include Al, Cu, and/or Ti, and may be in a single layer or multilayer including the aforementioned material.

A second organic insulating layer 111 may be arranged between the connection metal CM and a pixel electrode 210. The second organic insulating layer 111 may include an organic insulating material, such as acryl, BCB, polyimide, HMDSO, or the like.

According to the embodiments corresponding to FIG. 7, the pixel circuit PC and the pixel electrode 210 may be electrically connected to each other through the connection metal CM. According to one or more other embodiments, the connection metal CM may be omitted. For example, one organic insulating layer may be located between the pixel circuit PC and the pixel electrode 210. Alternatively, three or more organic insulating layers may be located between the pixel circuit PC and the pixel electrode 210, and the pixel circuit PC and the pixel electrode 210 may be electrically connected to each other through a plurality of connection metals.

The pixel electrode 210 may be formed on the second organic insulating layer 111. The pixel electrode 210 may be a (semi-)transparent electrode or a reflective electrode.

When the pixel electrode 210 is a (semi-)transparent electrode, the pixel electrode 210 may include, for example, ITO, IZO, ZnO, $In_2O_3$, IGO, or AZO. When the pixel electrode 210 is a reflective electrode, a reflective layer may be formed using Ag, Mg, Al, Pt, Pd, Au, Ni, Nd, Ir, Cr, or a compound thereof, and a layer including ITO, IZO, ZnO or $In_2O_3$ may be formed on the reflective layer. In one or more embodiments, the pixel electrode 210 may have a structure in which an ITO layer, an Ag layer, and an ITO layer are sequentially stacked.

An organic bank layer 400, which has a pixel opening 400OP1 overlapping the pixel electrode 210, and which covers an edge of the pixel electrode 210, may be located on the second organic insulating layer 111. A portion of the upper surface of the pixel electrode 210 may be exposed through the pixel opening 400OP1 of the organic bank layer 400. An emission area EA of the pixel P may be defined by the pixel opening 400OP1.

The organic bank layer 400 may be in black. The organic bank layer 400 may include a light-blocking material and may be provided in black. The light-blocking material may include resin or paste including carbon black, carbon nanotube, or black dye, metal particles, for example, Ni, Al, Mo, and an alloy thereof, metal oxide particles, for example, a chromium oxide, metal nitride particles, for example, a chromium nitride, or the like. When the organic bank layer 400 includes a light-blocking material, outer reflection due to metal structures arranged below the organic bank layer 400 may be reduced.

An auxiliary electrode 600 may be located on the organic bank layer 400 and may be spaced from the pixel opening 400OP1. The auxiliary electrode 600 may include a first sub-electrode 610, a second sub-electrode 620, and a cover electrode 630 covering the upper surface of the second sub-electrode 620.

The first sub-electrode 610 and the second sub-electrode 620 may include different metal materials. The first sub-electrode 610 and the second sub-electrode 620 may include metal materials having different etch selectivity. For example, the first sub-electrode 610 may include Mo, and the second sub-electrode 620 may include Ti.

In one or more embodiments, a thickness t4 of the first sub-electrode 610 may be about 2,500 Å to about 6,000 Å. When the thickness t4 of the first sub-electrode 610 is less than about 2,500 Å, the side surface of the first sub-electrode 610 may be mostly covered by an intermediate layer 220 of a light-emitting diode ED to be described below, and thus, an opposite electrode 230 may not sufficiently contact the first sub-electrode 610. When the thickness t4 of the first sub-electrode 610 exceeds about 6,000 Å, the thickness of the display apparatus 1 may be unnecessarily increased.

The second sub-electrode 620 may be located on the first sub-electrode 610. The second sub-electrode 620 may have a tip PT protruding outward from the upper surface of the first sub-electrode 610. A protrusion length of the tip PT protruding from the side surface of the first sub-electrode 610 may be about 2 μm or less. The protrusion length of the tip PT protruding from the side surface of the first sub-electrode 610 may be about 0.3 μm to about 1 μm, or may be about 0.3 μm to about 0.7 μm.

A cover electrode 630 may cover the upper surface of the second sub-electrode 620. The cover electrode 630 may include a material having a higher Young's modulus than a material constituting the second sub-electrode 620. In one or more embodiments, the Young's modulus of the second sub-electrode 620 may be about 600 GPa or more. For example, when the second sub-electrode 620 includes Ti, the cover electrode 630 may include TiN. As the cover electrode 630 is located on the second sub-electrode 620, deformation of the tip PT of the second sub-electrode 620 by a subsequent process, such as cleaning, may be reduced or prevented.

In one or more embodiments, a thickness t5 of the second sub-electrode 620 and the cover electrode 630 from the lower surface of the second sub-electrode 620 to the upper surface of the cover electrode 630 may be about 500 Å to about 2,000 Å. When the thickness t5 of the second sub-electrode 620 and the cover electrode 630 is less than 500 Å, the tip PT may be deformed or lost. When the thickness t5 of the second sub-electrode 620 and the cover electrode 630 exceeds 2,000 Å, the thickness of the display apparatus 1 may be unnecessarily increased.

The intermediate layer 220 may cover the pixel electrode 210 and the organic bank layer 400. The intermediate layer 220 may include an emission layer including a high molecular weight or a low molecular weight organic material that emits light of a corresponding color (red, green, or blue). In one or more embodiments, the emission layer may include an inorganic material or quantum dots.

The intermediate layer 220 may include a first functional layer arranged between the pixel electrode 210 and the emission layer and/or a second functional layer arranged between the emission layer and the opposite electrode 230. The first functional layer may include an HTL and/or an HIL. The second functional layer may include an ETL and/or an EIL.

The emission layer may have a single stack structure including a single emission layer, or a tandem structure that is a multi-stack structure including a plurality of emission layers. When the emission layer has a tandem structure, a CGL may be located between the plurality of stacks.

In one or more embodiments, the emission layer may be patterned using a fine metal mask (FMM) corresponding to the pixel electrode 210. On the other hand, the first functional layer and/or the second functional layer may be formed over the entire surface of the substrate 100 to overlap not only the emission area EA but also a non-emission area NEA.

Because the intermediate layer 220 is formed to overlap the emission area EA and the non-emission area NEA, a deposition material for forming the intermediate layer 220 may form a dummy intermediate layer 220b from the upper surface of the cover electrode 630 to the side surface of the tip PT. The intermediate layer 220 and the dummy intermediate layer 220b may be separated and spaced apart from each other by the tip PT.

The opposite electrode 230 may be located on the intermediate layer 220. The opposite electrode 230 may include a conductive material having a low work function. For example, the opposite electrode 230 may include a (semi-)transparent layer including Ag, Mg, Al, Pt, Pd, Au, Ni, Nd, Ir, Cr, Li, Ca, or an alloy thereof. Alternatively, the opposite electrode 230 may further include a layer including ITO, IZO, ZnO, or $In_2O_3$ on the (semi-)transparent layer including the material described above. In one or more embodiments, a capping layer may be formed on the opposite electrode 230.

The opposite electrode 230 may be formed to overlap the emission area EA and the non-emission area NEA. Accordingly, a deposition material for forming the opposite electrode 230 may form a dummy opposite electrode 230b covering the upper surface of the dummy intermediate layer 220b. The opposite electrode 230 and the dummy opposite electrode 230b may be separated and spaced apart from each other by the tip PT. The opposite electrode 230 and the dummy opposite electrode 230b may include the same material and/or the same number of sub-layers.

In one or more embodiments, the intermediate layer 220 may be formed using a thermal evaporation process, and the opposite electrode 230 may be formed using a sputtering process. The deposition material for forming the opposite electrode 230 may be incident at an angle compared to the deposition material for forming the intermediate layer 220 based on a direction (e.g., z direction) that is substantially perpendicular to the substrate 100. Accordingly, the opposite electrode 230 may directly contact the side surface of the first sub-electrode 610 on which the intermediate layer 220 is not formed by being covered by the tip PT of the second sub-electrode 620.

Because the auxiliary electrode 600 is electrically connected to the common power supply line 16 (see FIG. 2), the opposite electrode 230 may receive the common voltage ELVSS through the first sub-electrode 610.

An inorganic encapsulation layer 510 may be formed on the opposite electrode 230. The inorganic encapsulation layer 510 may be formed over the entire surface of the substrate 100. The inorganic encapsulation layer 510 may include one or more inorganic insulating materials, such as silicon oxide, silicon nitride, silicon oxynitride, aluminum oxide, titanium oxide, tantalum oxide, hafnium oxide, or zinc oxide, and may be formed by a CVD method or the like.

Because the inorganic encapsulation layer 510 has relatively excellent step coverage, the inorganic encapsulation layer 510 may continuously cover the upper surface of the dummy opposite electrode 230b, the lower surface of the tip PT of the second sub-electrode 620, the side surface of the first sub-electrode 610, and the upper surface of the opposite electrode 230. The inorganic encapsulation layer 510 may have improved adhesion due to the unevenness of the tip PT, and thus, peeling of the inorganic encapsulation layer 510 may be prevented or reduced.

Referring to FIG. 8, the auxiliary electrode 600 may be located between a first organic insulating layer 109 and a second organic insulating layer 111, and the second organic insulating layer 111 may have/define a recessed portion 1110P overlapping the auxiliary electrode 600. The recessed portion 1110P may be located in the non-emission area NEA.

The organic bank layer 400 may have/define an auxiliary opening 400OP2 overlapping the auxiliary electrode 600. When viewed from a direction substantially perpendicular to the upper surface of the substrate 100, the auxiliary opening 400OP2 may be located in the recessed portion 1110P. The auxiliary electrode 600 may be exposed from the organic bank layer 400 and the second organic insulating layer 111 by the auxiliary opening 400OP2 and the recessed portion 1110P.

As shown in FIG. 8, the auxiliary electrode 600 may be located on or at the same layer as the connection metal CM. In one or more other embodiments, the auxiliary electrode 600 may be located between a second interlayer insulating layer 107 and the first organic insulating layer 109, and the first organic insulating layer 109 may have/define a recessed portion overlapping the auxiliary electrode 600. In this case, the auxiliary electrode 600 may be located on or at the same layer as the source electrode and/or the drain electrode of the pixel circuit PC.

The auxiliary electrode 600 may include a first sub-electrode 610, a second sub-electrode 620, and a cover electrode 630 covering the upper surface of the second sub-electrode 620.

The first sub-electrode 610 and the second sub-electrode 620 may include different metal materials. The first sub-electrode 610 and the second sub-electrode 620 may include metal materials having different etch selectivity. For example, the first sub-electrode 610 may include Mo, and the second sub-electrode 620 may include Ti.

In one or more embodiments, the thickness of the first sub-electrode 610 may be about 2,500 Å to about 6,000 Å. When the thickness of the first sub-electrode 610 is less than about 2,500 Å, the side surface of the first sub-electrode 610 may be mostly covered by an intermediate layer 220 of a light-emitting diode ED, and thus, an opposite electrode 230 may not sufficiently contact the first sub-electrode 610. When the thickness of the first sub-electrode 610 exceeds about 6,000 Å, the thickness of the display apparatus 1 may be unnecessarily increased.

The second sub-electrode 620 may be located on the first sub-electrode 610. The second sub-electrode 620 may have a tip PT protruding outward from the upper surface of the first sub-electrode 610. A protrusion length of the tip PT protruding from the side surface of the first sub-electrode 610 may be about 2 μm or less. The protrusion length of the tip PT protruding from the side surface of the first sub-electrode 610 may be about 0.3 μm to about 1 μm, or may be about 0.3 μm to about 0.7 μm.

A cover electrode 630 may cover the upper surface of the second sub-electrode 620. The cover electrode 630 may include a material having a higher Young's modulus than a material constituting the second sub-electrode 620. In one or more embodiments, the Young's modulus of the second sub-electrode 620 may be about 600 GPa or more. For example, when the second sub-electrode 620 includes Ti, the cover electrode 630 may include TiN. As the cover electrode 630 is located on the second sub-electrode 620, deformation of the tip PT of the second sub-electrode 620 by a subsequent process, such as cleaning, may be reduced or prevented.

In one or more embodiments, the thickness of the second sub-electrode 620 and the cover electrode 630 from the lower surface of the second sub-electrode 620 to the upper surface of the cover electrode 630 may be about 500 Å to about 2,000 Å. When the thickness of the second sub-electrode 620 and the cover electrode 630 is less than about 500 Å, the tip PT may be deformed or lost. When the thickness of the second sub-electrode 620 and the cover electrode 630 exceeds about 2,000 Å, the thickness of the auxiliary electrode 600 may be unnecessarily increased.

The intermediate layer 220 may cover the pixel electrode 210 and the organic bank layer 400. The intermediate layer 220 may include an emission layer including a high molecular weight or low molecular weight organic material that emits light of a corresponding color (red, green, or blue). In one or more embodiments, the emission layer may include an inorganic material or quantum dots.

The intermediate layer 220 may extend to the upper surface of the first organic insulating layer 109 exposed by the auxiliary opening 400OP2 and the recessed portion 1110P, and may extend along the side of the organic bank layer 400 forming the auxiliary opening 400OP2. Because the intermediate layer 220 is formed to overlap the emission area EA and the non-emission area NEA, a deposition material for forming the intermediate layer 220 may form a dummy intermediate layer 220b from the upper surface of the cover electrode 630 to the side surface of the tip PT. The intermediate layer 220 and the dummy intermediate layer 220b may be separated and spaced apart from each other by the tip PT.

The opposite electrode 230 may be located on the intermediate layer 220. The opposite electrode 230 may include a conductive material having a low work function. In one or more embodiments, a capping layer may be formed on the opposite electrode 230.

The opposite electrode 230 may be formed to overlap the emission area EA and the non-emission area NEA. Accordingly, a deposition material for forming the opposite electrode 230 may form a dummy opposite electrode 230*b* covering the upper surface of the dummy intermediate layer 220*b*. The opposite electrode 230 and the dummy opposite electrode 230*b* may be separated and spaced apart from each other by the tip PT. The opposite electrode 230 and the dummy opposite electrode 230*b* may include the same material and/or the same number of sub-layers.

The opposite electrode 230 may directly contact the side surface of the first sub-electrode 610 on which the intermediate layer 220 is not formed by being covered by the tip PT of the second sub-electrode 620.

Because the auxiliary electrode 600 is electrically connected to the common power supply line 16 (see FIG. 2), the opposite electrode 230 may receive the common voltage ELVSS through the first sub-electrode 610.

An inorganic encapsulation layer 510 may be formed on the opposite electrode 230. The inorganic encapsulation layer 510 may be formed over the entire surface of the substrate 100. The inorganic encapsulation layer 510 may include one or more inorganic insulating materials, such as silicon oxide, silicon nitride, silicon oxynitride, aluminum oxide, titanium oxide, tantalum oxide, hafnium oxide, or zinc oxide, and may be formed by a CVD method or the like.

Figure 9:
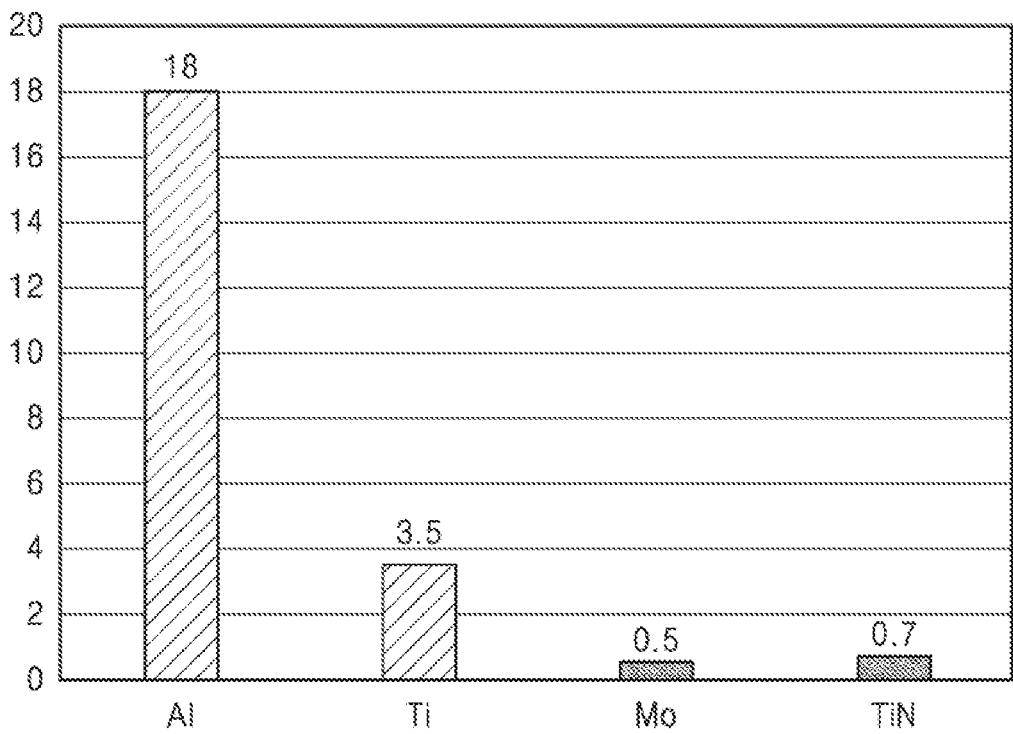
FIG. 9 is a graph showing the contact resistance of metal materials.

FIG. 9 is a graph showing the contact resistance of metal materials.

FIG. 9 is a graph obtained by measuring the contact resistance of each of the metal materials when the diameter of a contact hole is about 3.5 μm. As shown in FIG. 9, an Al metal layer has a resistance of about 18Ω due to aluminum oxide formed at the interface of the metal layer. On the other hand, in the case of a Mo metal layer, molybdenum oxide formed when the metal layer is exposed to air has conductivity and may be suitably removed through cleaning or the like. Accordingly, the Mo metal layer has a low resistance of about 0.5Ω. In addition, a Ti metal layer and a TiN layer have lower contact resistance than the Al metal layer. In the embodiments shown in FIGS. 5 to 7, because a contact area where an opposite electrode contacts a metal layer under a tip is relatively very narrow, it is suitable to lower the contact resistance between the opposite electrode and the metal layer.

In the case of the Ti metal layer, when a protruding structure, such as a tip having a Young's modulus of 116 GPa, is formed, there is a relatively high possibility of bending deformation by a process such as cleaning. The TiN layer has a relatively high Young's modulus of 600 GPa and a relatively low contact resistance. However, when a tip is formed using only the TiN layer, defects such as breakage may occur. Therefore, by forming a tip having a double layer structure including Ti and TiN, the mechanical reliability of the structure of the tip may be improved.

According to the embodiments made as described above, a display apparatus capable of displaying a high-quality image by reducing a luminance difference according to a location may be implemented. However, the scope of the disclosure is not limited by these effects.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:
a pixel electrode;
a bank layer comprising an inorganic bank layer and a conductive bank layer that are sequentially stacked, and that define a pixel opening overlapping the pixel electrode;
an intermediate layer above the pixel electrode and in the pixel opening; and
an opposite electrode above the intermediate layer,
wherein the conductive bank layer comprises a first metal layer, a second metal layer having a tip protruding from the first metal layer toward a center of the pixel opening, and a cover layer covering the second metal layer.

2. The display apparatus of claim 1, wherein the opposite electrode directly contacts a side surface of the first metal layer.

3. The display apparatus of claim 1, wherein a Young's modulus of the cover layer is greater than a Young's modulus of the second metal layer.

4. The display apparatus of claim 1, wherein the first metal layer comprises molybdenum.

5. The display apparatus of claim 1, wherein the second metal layer comprises titanium, and wherein the cover layer comprises titanium nitride.

6. The display apparatus of claim 1, wherein a thickness of the first metal layer is about 2,500 Å to about 6,000 Å.

7. The display apparatus of claim 1, wherein a thickness of the second metal layer and the cover layer is about 500 Å to about 2,000 Å.

8. The display apparatus of claim 1, further comprising a protective layer between the inorganic bank layer and the pixel electrode, and overlapping an edge of the pixel electrode.

9. The display apparatus of claim 1, further comprising an inorganic encapsulation layer above the opposite electrode, and directly contacting a lower surface of the tip of the second metal layer.

10. The display apparatus of claim 1, further comprising a dummy intermediate layer and a dummy opposite electrode above the bank layer,
wherein the dummy intermediate layer is separated from the intermediate layer, and
wherein the dummy opposite electrode is separated from the opposite electrode by the tip.

11. An electronic device comprising a display apparatus, the display apparatus comprising:
a pixel electrode;
a bank layer comprising an inorganic bank layer and a conductive bank layer that are sequentially stacked, and that define a pixel opening overlapping the pixel electrode;
an intermediate layer above the pixel electrode and in the pixel opening; and
an opposite electrode above the intermediate layer,
wherein the conductive bank layer comprises a first metal layer, a second metal layer having a tip protruding from the first metal layer toward a center of the pixel opening, and a cover layer covering the second metal layer.

12. The electronic device of claim 11, wherein the opposite electrode directly contacts a side surface of the first metal layer.

13. The electronic device of claim 11, wherein a Young's modulus of the cover layer is greater than a Young's modulus of the second metal layer.

14. The electronic device of claim 11, wherein the first metal layer comprises molybdenum.

15. The electronic device of claim 11, wherein the second metal layer comprises titanium, and wherein the cover layer comprises titanium nitride.

16. The electronic device of claim 11, wherein a thickness of the first metal layer is about 2,500 Å to about 6,000 Å.

17. The electronic device of claim 11, wherein a thickness of the second metal layer and the cover layer is about 500 Å to about 2,000 Å.

18. The electronic device of claim 11, wherein the display apparatus further comprises a protective layer between the inorganic bank layer and the pixel electrode, and overlapping an edge of the pixel electrode.

19. The electronic device of claim 11, wherein the display apparatus further comprises an inorganic encapsulation layer above the opposite electrode, and directly contacting a lower surface of the tip of the second metal layer.

20. The electronic device of claim 11, wherein the display apparatus further comprises a dummy intermediate layer and a dummy opposite electrode above the bank layer, wherein the dummy intermediate layer is separated from the intermediate layer, and wherein the dummy opposite electrode is separated from the opposite electrode by the tip.

* * * * *